(12) United States Patent
Chang et al.

(10) Patent No.: US 9,312,856 B2
(45) Date of Patent: Apr. 12, 2016

(54) SCHEME FOR 3D VOLTAGE TYPE TSV SIGNAL TRANSMISSION

(71) Applicant: National Tsing Hua University, Hsin Chu (TW)

(72) Inventors: Meng-Fan Chang, Taichung (TW); Tsung-Hsien Huang, Hsinchu (TW); Pei-Yuan Li, New Taipei (TW)

(73) Assignee: National Tsing Hua University, Hsin Chu (TW)

( * ) Notice: Subject to any disclaimer, the term of this patent is extended or adjusted under 35 U.S.C. 154(b) by 234 days.

(21) Appl. No.: 14/146,017

(22) Filed: Jan. 2, 2014

(65) Prior Publication Data

US 2015/0188540 A1    Jul. 2, 2015

(51) Int. Cl.
*H03K 19/003* (2006.01)
*H03K 19/08* (2006.01)
*H03K 19/00* (2006.01)

(52) U.S. Cl.
CPC .......... *H03K 19/0008* (2013.01); *H03K 19/003* (2013.01); *H03K 19/08* (2013.01)

(58) Field of Classification Search
CPC . H03K 17/16; H03K 19/003; H03K 19/0008; H01L 25/00

USPC .............................. 326/21, 37, 38, 39, 41, 47
See application file for complete search history.

(56) References Cited

U.S. PATENT DOCUMENTS

| 2011/0074460 | A1* | 3/2011 | Ku | H04L 25/0272 326/21 |
| 2011/0319015 | A1* | 12/2011 | Canegallo | H04B 5/0012 455/41.1 |
| 2014/0145753 | A1* | 5/2014 | Tseng | H03K 19/003 326/9 |

* cited by examiner

*Primary Examiner* — Daniel D Chang
(74) *Attorney, Agent, or Firm* — Chih Feng Yeh; Huntington IP Consulting Co., Ltd.

(57) ABSTRACT

A method for 3D voltage type TSV signal transmission, comprising transmitting a full swing signal of data with a first voltage through TSVs for each one of a plurality of slave devices to determine a transmission time required for data transmission to a master device. Then, full swing signal is sensed by the master device for reduce the first voltage to be a small swing signal with lower voltage. Logic "0" signals or logic "1" signals with the lower voltage are transmitted through the TSVs by the plurality of slave devices. It is sharing charge and balancing voltage level to a mean value for the logic "1" signals or the logic "0" signals by the master device.

17 Claims, 2 Drawing Sheets

SCHEME FOR 3D VOLTAGE TYPE TSV SIGNAL TRANSMISSION

TECHNICAL FIELD

The present invention is generally relevant to a 3D stacked chip device, specifically, a 3D voltage type TSV signal transmission scheme.

BACKGROUND

Recently, portable electronic equipment such as mobile telephones and non-volatile semiconductor memory media such as IC memory cards have been downsized, and there have been increasing demands for reducing the number of parts used in the equipment and media and downsizing thereof. Therefore, in the semiconductor industry, packaging technologies for integrated circuits (ICs) have been advancing to meet requirements for miniaturization and mounting reliability. For example, the requirement for miniaturization results in acceleration of technological development for a package having a similar size in relation to a semiconductor chip. Further, the requirement for mounting reliability places importance on packaging technologies that are capable of enhancing efficiency of a mounting process and improving mechanical and electrical reliability after the mounting process is completed. Thus, there have been considerable activities in the development of efficiently packaging a semiconductor chip. As packages that meet the demands, there are a chip scale package (CSP) having a package size substantially equal to that of the semiconductor chip, a multi-chip package (MCP) in which multiple semiconductor chips are incorporated into a single package, and a package-on-package (POP) in which multiple packages are stacked and combined into a single-piece member.

In pace with the development of technology, in response to an increase in storage capacity required for memory and the like, stacked type semiconductor devices (multichip devices) have been proposed which have semiconductor integrated circuit chips stacked together. Namely, there is provided a stacked type semiconductor device formed of at least two semiconductor integrated circuit devices stacked, each having a specification and including a semiconductor integrated circuit chip, wherein each of the semiconductor integrated circuit devices includes a conductor that penetrates the semiconductor integrated circuit device, and the semiconductor integrated circuit devices are electrically connected by the conductors and a value of the specification, excluding a size, of the uppermost semiconductor integrated circuit device or the lowermost semiconductor integrated circuit device is maximum or minimum. Consequently, the stacked type semiconductor device has a plurality of chips stacked in a vertical direction. In the stacked type semiconductor device, the chips are electrically connected together via, for example, through plugs that penetrate the chips. Thus, to select a desired one of the stacked memory chips of the same structure is an important task. If a stacked type semiconductor device is manufactured, chips may be individually subjected to operation tests so that only normal chips can be sorted out and stacked.

One of the technologies to offer vertical connection is called Through-Silicon-Via (TSV) which has emerged as a promising solution in 3D stacked devices. It is a technology where vertical interconnects are formed through the wafer to enable communication among the stacked chips. TSV is 3D IC technique for signal transmission. It's a vertical electrical connection passing completely through a silicon wafer or die. People believe that 3D IC with TSV technique is the future design. It can help the IC process break its physical limit of shrinking and IC developments keep up with the Moore's Law. Features of TSV describes as follow: 1). 3D TSV signal transmission has smaller RC (Resistance multiply capacitance) loading compared with 2D global metal routing; 2). using TSV technique, chip can have higher performance; 3). TSV has large capacitance and small resistance; and 4). large capacitance would cause large energy consumption.

To address the above shortcomings, the invention's scheme and method are proposed.

SUMMARY

To address the above shortcomings, a scheme for 3D (three dimensional) voltage type TSV signal transmission is proposed.

One feature of the invention is proposed a method for 3D voltage type TSV signal transmission, the method including a step of transmitting a full swing signal of data with a first voltage through TSVs for each one of a plurality of slave devices to determine a transmission time required for data transmission to a master device. Then, full swing signal is sensed by the master device for reduce the first voltage to be a second voltage lower than the first voltage. Logic "0" signals or logic "1" signals with the second voltage are transmitted through the TSVs by the plurality of slave devices. It is sharing charge and balancing voltage level to a mean value for the logic "1" signals or the logic "0" signals by the master device.

The full swing signal has a pseudo voltage. The full swing signal is transmitted by a transmitter of the slave device. The full swing signal is transmitted synchronously with a clock signal generated by a pulse generator of the slave device. The full swing signals are generated with different voltage value. The transmission time is positive correlation with TSV loading.

The sensed full swing signal is received by a receiver of the master device. each of said logic "0" signals or each of said logic "1" signals are transmitted by a transmitter of the slave device.

All TSVs can be connected to share charge after small swing signals transmitting on TSVs.

Each of the slave devices includes at least one transmitter for transmitting full swing signal, logic "0" signals or logic "1" signals. Each of the slave devices includes at least one pulse generator for generating a clock signal. The master device includes a receiver for receiving the sensed full swing signal. The master device includes a voltage sense amplifier for sensing the full swing signal.

The master device includes a phase compare circuit to generate a phase adjustment instruction signal to adjust clock signals of the slave devices and/or clock signal of the master device to an equal phase.

The plurality of slave devices and the master device are stacked in layer-by-layer.

BRIEF DESCRIPTION OF THE DRAWINGS

The attached specifications and drawings outline the preferred embodiments of the invention, including the details of its components, characteristics and advantages.

DETAILED DESCRIPTION

Next, the preferred embodiments of the invention are described in further detail. Notably, however, the preferred embodiments are provided for illustration purposes rather than for limiting the use of the invention. The invention is also applicable in many other embodiments besides those explicitly described, and the scope of the invention is not expressly limited except as specified in the accompanying claims.

A voltage type TSV data transmission scheme for 3D non-volatile memory cube or 3D volatile memory cube is proposed. For input and output TSV data transmission, different types of TSV transmission may be used to optimize the transmission energy and transmission time. For the input TSV data transmission (volatile memory to non-volatile memory), TSV data transmission scheme for pseudo voltage mode of charge sharing is proposed. In the invention, voltage difference is used to determine the data value during data transmission. Current change during transmission process is not concerned. For example, voltage type TSV data transmission scheme can be applied for buffers, voltage sense amplifiers.

In the invention, voltage type (mode) TSV transmission scheme is used to transmit data with different voltage value. The voltage type TSV transmission scheme has the ability of TSV loading tracking, small voltage swing and charge sharing.

In the invention, a 3D TSV data transmission scheme may be applied to a 3D-IC stacked device. The 3D TSV data transmission scheme includes a master device and a plurality of slave devices. Signal between the master device (layer) and the slave devices (layers) is transmitted through TSVs.

Figure 1:
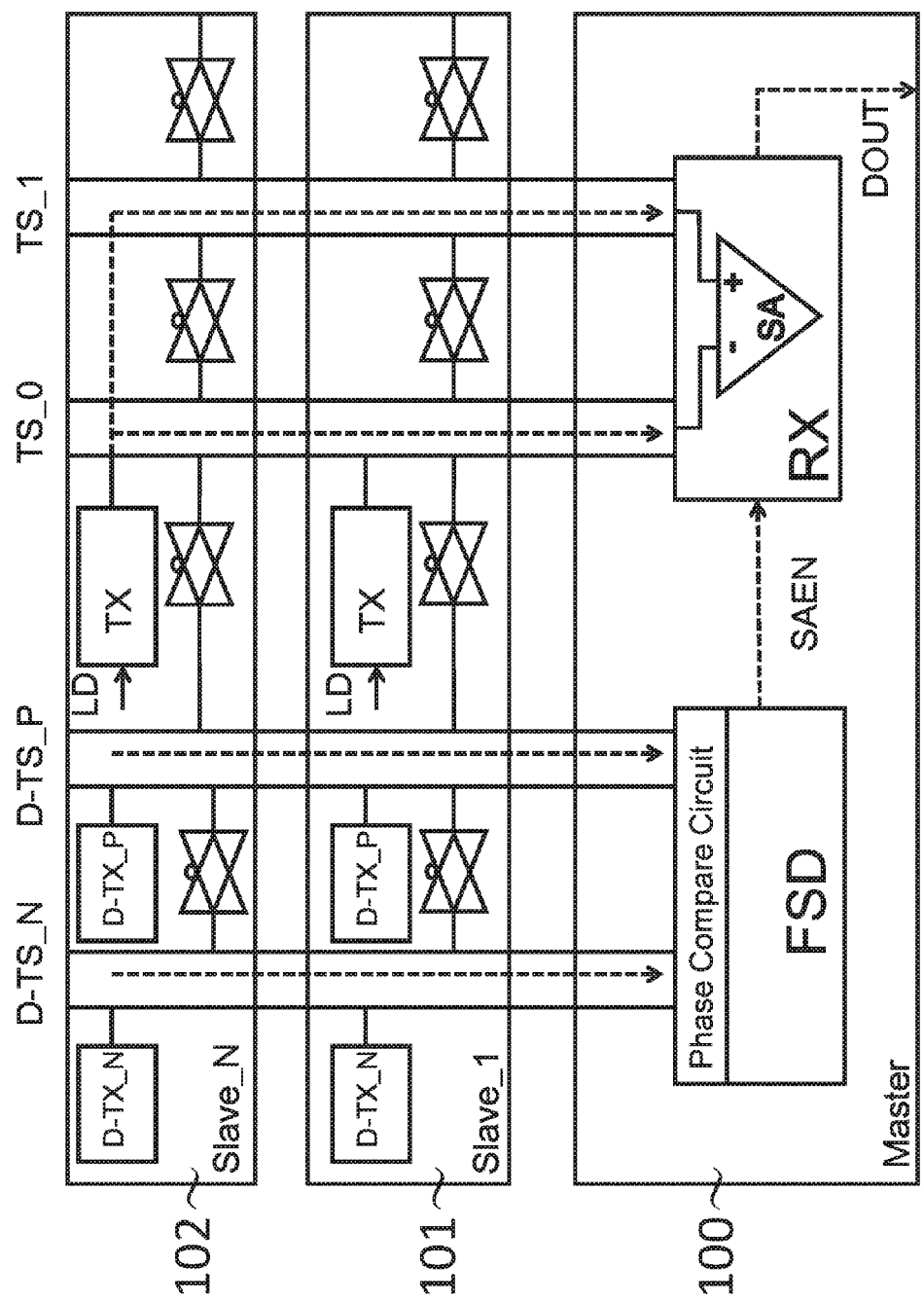
FIG. 1 shows a 3D voltage type TSV signal transmission circuit of an embodiment according to the invention.

FIG. 1 shows a 3D voltage type TSV signal transmission circuit of an embodiment according to the invention. The circuit shown in FIG. 1 includes non-volatile memory for storage, but not to be limited. TSVs are used for 3D nonvolatile memory cube interface or 3D volatile memory cube interface. FIG. 1 depicts a typical TSV signal transmission circuit that may benefit from the use of the embodiments. The TSV signal transmission circuit includes a master device 100 and N number of slave devices including from slave_1 device 101 to slave_N device 102. The scheme for the TSV signal transmission circuit is constructed from the bottom layer of the master device 100 to the N layers slave devices stacked layer by layer. In one embodiment, each slave device has the same circuit structure. In general, each of the slave devices 101, 102 has a transmitter (TX) and a receiver (RX) for bi-direction communication, and a pulse generator (PG). As the same, the master device 100 also has a transmitter (TX), a receiver (RX) and a pulse generator (PG). For this reason, in a circuit system including the master device 100 and the slave devices 101 to 102, wherein the master device incorporates a pulse counter therein besides a pulse generator (PG) to control the generation of the synchronizing clock pulse by writing in local data (LD) for the slave device 101, 102. The number of generated pulses of the synchronizing clock corresponding to the total data number for loading the local data from the slave devices 101, 102 to the whole circuit system.

According to one aspect of the embodiments, a 3D voltage type TSV signal transmission circuit may include slave devices (from slave_1 device 101 to slave_N device 102) and a master device 100. Each of the slave devices may include a slave side clock signal generator (or pulse generator) section coupled to generate a slave side clock signal. The clock signal generator (or pulse generator) section may include a plurality of clock signal generators (or pulse generators) for different type signals transmission. A phase adjusting circuit may be incorporated into the slave devices or the master device, coupled to control a phase of the slave side clock signal. A slave side input section is coupled to sample the master side output signal, transmitted through a bus line, in response to the slave side clock signal A slave output section may be coupled to output a transmission data signal in response to the slave side clock signal. The slave output section may include a plurality of transmitters (TXs) for transmitting local data (LD). As the same, the master device may include a master side clock signal generation section coupled to generate a master side clock signal. A master input section may be coupled to sample the local data signal transmitted from the slave devices through TSVs. A phase compare circuit may be incorporated into the master device, coupled to generate a phase adjustment instruction signal based-on the slave side clock signal transmitted from the slave devices through TSVs and the master side clock signal. In one embodiment, the phase adjusting circuit may be coupled to receive the phase adjustment instruction signal to adjust the phase of the slave side clock signal.

In one embodiment, the slave device (101, 102) may include a phase adjusting data generator section coupled to generate the phase adjusting data in response to the slave side clock signal such that different values may be alternatively repeated every n cycles of the slave side clock signal. The master device may include a phase compare circuit to generate a phase adjustment instruction signal to adjust clock signals of the slave side and/or clock signal of the master side to an equal phase for facilitating charge sharing.

Figure 2:
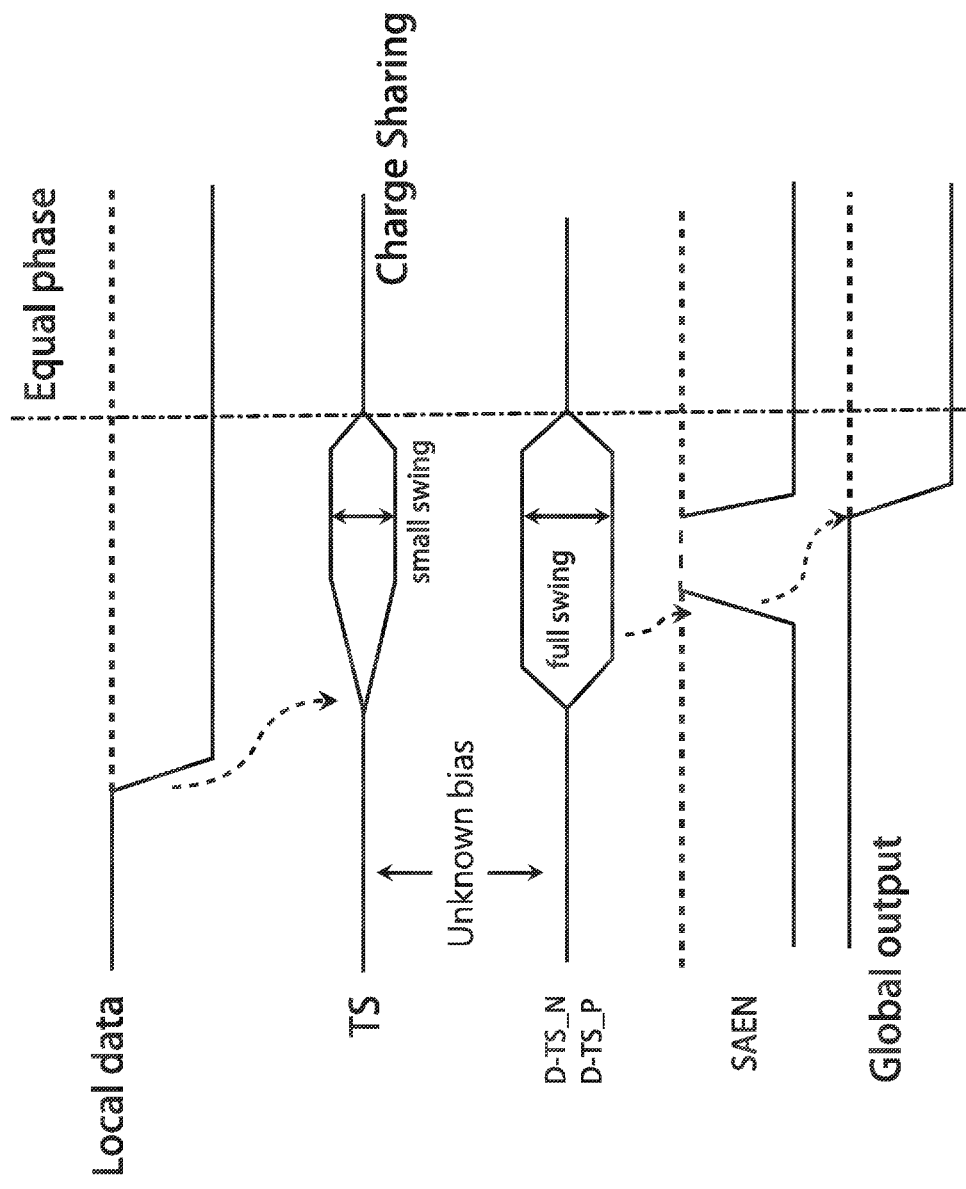
FIG. 2 shows a waveform of 3D voltage type TSV signal transmission according to the invention.

FIG. 2 shows a waveform of 3D voltage type TSV signal transmission according to the invention. In one embodiment, based-on the 3D voltage type TSV signal transmission circuit structure shown in the FIG. 1, a method for 3D voltage type TSV signal transmission is described as follows:

(I). TSV Loading Tracking:

First, a full swing signal with a pseudo voltage is transmitted through TSV by a slave device to determine the transmission time required for the TSV data transmission to a master device. For example, a transmitter (D-TX_N) of the slave_1 device 101/slave_N device 102 transmits a full swing signal of transmission data (D-TS_N). As the same, a transmitter (D-TX_P) of the slave_1 device 101/slave_N device 102 transmits a full swing signal of transmission data (D-TS_P). Waveform of the full swing signal transmitted by transmitter (D-TX_N) or transmitter (D-TX_P) is shown in FIG. 2. The transmission data is for example a tracking data or a search data. In one embodiment, the tracking data or the search data (SD) is transmitted synchronously with the clock signal. The tracking data or the search data is fetched to FSD device of the master device 100. The FSD device has a sense amplifier which has P-channel MOS transistors.

In the proposed voltage type (mode) TSV transmission scheme, the full swing signals of transmission data are generated with different voltage value. Transmission time of the full swing signal of transmission data has something to do with value of TSV loading. If the TSV loading increases or reduces, then the transmission time would increase or reduce as well. In other words, TSV loading is positive correlation with the transmission time. According to this approach, TSV loading can be tracked and timing control can be improved.

(II). Small Swing:

Second, when the data is transmitting on TSV, a voltage sense amplifier can be used to sense the data for output. That is, the sense amplifier of the master device activates the full swing signal to be a sense amplifier enable signal (SAEN). Waveform of SAEN is shown in FIG. 2. In one embodiment, the SAEN is received by a receiver (RX) of the master device 100. For example, the receiver (RX) has N-channel MOS transistors and P-channel MOS transistors for receiving signal from FSD device. Then, tracking data or search data is outputted (global output) from an output terminal (Dout) of the master device 100. For example, the data is outputted to the output terminal (Dout) through the output buffer. With the voltage sensing scheme, the voltage swing on TSV can be reduced to a small swing voltage (such as 100 mV).

(III). Charge Sharing:

Local data (LD) of the slave device is outputted by the transmitter (TX) and transmitted through TSV. For example, based-on voltage sensing scheme, a transmitter (TX) of the slave_1 device 101/slave_N device 102 can transmit a small swing signal (logic "0" signal) of transmission data (TS_0) on TSV. As the same, a transmitter (TX) of the slave_1 device 101/slave_N device 102 can transmit a small swing signal (logic "1" signal) of transmission data (TS_1) on TSV. Waveform of the small swing signal transmitted by transmitter (TX) is shown in FIG. 2. As mentioned above, the master device 100 may include a phase compare circuit to generate a phase adjustment instruction signal to adjust the slave side clock signals and/or the master side clock signal to equal phase for facilitating charge sharing. After signal of the local data is transmitted on TSV, all the TSVs can be connected (conducted) to share the charge. Thus, logic "1" signals or logic "0" signals are transmitted through TSVs to share their charge and balance the voltage level to their mean value. Charge sharing of pseudo voltage mode TSV transmission scheme is achieved. Finally, the transmission energy used to charge low voltage TSVs could be saved with this scheme. Therefore, the transmission energy and transmission time of data can be optimized.

As noted above, the voltage type TSV transmission scheme of the invention can reach the purpose of TSV loading tracking, small voltage swing and charge sharing.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A method for 3D voltage type TSV signal transmission, comprising:

transmitting a full swing signal of data with a first voltage through TSVs for each one of a plurality of slave devices to determine a transmission time required for said data transmission to a master device;

sensing said full swing signal by said master device for reduce said first voltage to be a second voltage lower than said first voltage;

transmitting logic "0" signals or logic "1" signals with said second voltage through said TSVs by said plurality of slave devices; and sharing charge of said TSV and balancing voltage level transmitted through said TSV to a mean value for said logic "1" signals or said logic "0" signals by said master device.

2. The method of claim 1, wherein said full swing signal is transmitted by a transmitter.

3. The method of claim 1, wherein said full swing signal is transmitted synchronously with a clock signal generated by a pulse generator.

4. The method of claim 1, wherein said full swing signals are generated with different voltage value.

5. The method of claim 1, wherein said transmission time is positive correlation with TSV loading.

6. The method of claim 1, wherein said sensed full swing signal is received by a receiver.

7. The method of claim 6, wherein said receiver includes N-channel MOS transistors and P-channel MOS transistors.

8. The method of claim 1, wherein each of said logic "0" signals or each of said logic "1" signals are transmitted by a transmitter.

9. The method of claim 1, wherein said full swing signal has a pseudo voltage.

10. The method of claim 1, wherein all said TSVs can be connected to share said charge by a pulse qenerator.

11. The method of claim 1, wherein each of said plurality of slave devices includes at least one transmitter for transmitting said full swing signal.

12. The method of claim 1, wherein each of said plurality of slave devices includes at least one transmitter for transmitting said logic "0" signals or said logic "1" signals.

13. The method of claim 1, wherein each of said plurality of slave devices includes at least one pulse generator for generating a clock signal.

14. The method of claim 1, wherein said master device includes a receiver.

15. The method of claim 1, wherein said master device includes a voltage sense amplifier for sensing said full swing signal.

16. The method of claim 13, wherein said master device includes a phase compare circuit to generate a phase adjustment instruction signal to adjust clock signals of said plurality of slave devices and/or clock signal of said master device to an equal phase.

17. The method of claim 13, wherein said plurality of slave devices and said master device are stacked in layer-by-layer.

* * * * *